(12) United States Patent
Hautala

(10) Patent No.: US 7,794,798 B2
(45) Date of Patent: Sep. 14, 2010

(54) METHOD FOR DEPOSITING FILMS USING GAS CLUSTER ION BEAM PROCESSING

(75) Inventor: John J. Hautala, Beverly, MA (US)

(73) Assignee: TEL Epion Inc., Billerica, MA (US)

( * ) Notice: Subject to any disclaimer, the term of this patent is extended or adjusted under 35 U.S.C. 154(b) by 341 days.

(21) Appl. No.: 11/864,961

(22) Filed: Sep. 29, 2007

(65) Prior Publication Data

US 2009/0087578 A1 Apr. 2, 2009

(51) Int. Cl.
*C23C 14/04* (2006.01)
(52) U.S. Cl. .................. 427/526; 427/527; 438/36; 438/37; 438/58; 438/87; 118/725; 118/726
(58) Field of Classification Search .................. 427/526, 427/585; 438/36–37, 58, 87; 118/723, 726; 156/345.1
See application file for complete search history.

(56) References Cited

U.S. PATENT DOCUMENTS

| | | | |
|---|---|---|---|
| 4,361,762 A | 11/1982 | Douglas | |
| 4,564,533 A | 1/1986 | Yamazaki | |
| 4,740,267 A | 4/1988 | Knauer et al. | |
| 4,794,064 A | 12/1988 | Yamazaki et al. | |
| 4,886,971 A | 12/1989 | Matsumura et al. | |
| 4,916,311 A | 4/1990 | Fuzishita et al. | |
| 5,094,879 A | 3/1992 | Matsuda et al. | |
| 5,907,780 A * | 5/1999 | Gilmer et al. | 438/299 |
| 7,259,036 B2 | 8/2007 | Borland et al. | |
| 7,288,491 B2 * | 10/2007 | Collins et al. | 438/780 |

(Continued)

FOREIGN PATENT DOCUMENTS

JP 62296357 A 12/1987

(Continued)

OTHER PUBLICATIONS

I. Yamada et al. Matierials Science and Engineering, R 34, (2001) 231-295.*

(Continued)

*Primary Examiner*—Lan Vinh
*Assistant Examiner*—Maki A Angadi
(74) *Attorney, Agent, or Firm*—Wood, Herron & Evans, LLP

(57) ABSTRACT

A method for depositing material on a substrate is described. The method comprises maintaining a reduced-pressure environment around a substrate holder for holding a substrate having a surface, and holding the substrate securely within the reduced-pressure environment. Additionally, the method comprises providing to the reduced-pressure environment a gas cluster ion beam (GCIB) from a pressurized gas mixture, accelerating the GCIB, and irradiating the accelerated GCIB onto at least a portion of the surface of the substrate to form a thin film. In one embodiment, the pressurized gas mixture comprises a silicon-containing specie and at least one of a nitrogen-containing specie or a carbon-containing specie for forming a thin film containing silicon and at least one of nitrogen or carbon. In another embodiment, the gas mixture comprises a metal-containing specie for forming a thin metal-containing film. In yet another embodiment, the pressurized gas mixture comprises a fluorocarbon-containing specie for forming a thin fluorocarbon-containing film.

53 Claims, 5 Drawing Sheets

U.S. PATENT DOCUMENTS

| | | |
|---|---|---|
| 2002/0130275 A1 | 9/2002 | Mack et al. |
| 2005/0181621 A1* | 8/2005 | Borland et al. ............... 438/752 |
| 2006/0093753 A1 | 5/2006 | Nickel |
| 2006/0105570 A1 | 5/2006 | Hautala et al. |
| 2007/0087034 A1 | 4/2007 | Binn et al. |
| 2007/0117342 A1* | 5/2007 | Chen et al. .................. 438/401 |

FOREIGN PATENT DOCUMENTS

| | | |
|---|---|---|
| JP | 08316231 A1 | 11/1996 |
| WO | 2009045740 A2 | 4/2009 |

OTHER PUBLICATIONS

Yamada, I. et al., Surface modification with gas cluster ion beams, Nuclear Instruments & Methods in Physics Research, vol. B79, Nov. 2, 1992, pp. 223-226, XP001031961, ISSN: 0168-583X.

Saitoh, Y et al., Acceleration of cluster and molecular ions by TIARA 3 MV tandem accelerator, vol. 452, No. 1-2, Sep. 21, 2000, pp. 61-66, XP004210610, ISSN: 0168-9002.

Borland et al., Doping and deposition, Solid State Technology, May 2004, pp. 114-117.

European Patent Office, Invitation to Pay Additional Fees and Partial International Search received in corresponding International Application No. PCT/US2008/076818 dated Mar. 17, 2009, 5 pp.

European Patent Office, International Search and Written Opinion received in related International Application No. PCT/US2008/076782 dated Dec. 12, 2008, 12 pp.

European Patent Office, International Search Report and Written Opinion received in corresponding International Application PCT/US2008/076818 dated May 15, 2009, 15 pp.

European Patent Office, International Search Report and Written Opionion received in corresponding International Application No. PCT/US2009/036275 dated Sep. 24, 2009, 14 pp.

* cited by examiner

METHOD FOR DEPOSITING FILMS USING GAS CLUSTER ION BEAM PROCESSING

CROSS-REFERENCE TO RELATED APPLICATIONS

This application is related to co-pending U.S. patent application Ser. No. 11/864,330, entitled "METHOD FOR DIRECTIONAL DEPOSITION USING A GAS CLUSTER ION BEAM" (EP-121), filed on Sep. 28, 2007, the entire content of which is incorporated by reference herein in its entirety.

BACKGROUND OF THE INVENTION

1. Field of Invention

The invention relates to a method for performing thin film deposition using a gas cluster ion beam (GCIB), and more particularly to a method for depositing silicon-containing films, metal-containing films, and/or fluorocarbon-containing films on a substrate using a GCIB.

2. Description of Related Art

Gas-cluster ion beams (GCIB's) are used for etching, cleaning, smoothing, and forming thin films. For purposes of this discussion, gas clusters are nano-sized aggregates of materials that are gaseous under conditions of standard temperature and pressure. Such gas clusters may consist of aggregates including a few to several thousand molecules, or more, that are loosely bound together. The gas clusters can be ionized by electron bombardment, which permits the gas clusters to be formed into directed beams of controllable energy. Such cluster ions each typically carry positive charges given by the product of the magnitude of the electronic charge and an integer greater than or equal to one that represents the charge state of the cluster ion.

The larger sized cluster ions are often the most useful because of their ability to carry substantial energy per cluster ion, while yet having only modest energy per individual molecule. The ion clusters disintegrate on impact with the substrate. Each individual molecule in a particular disintegrated ion cluster carries only a small fraction of the total cluster energy. Consequently, the impact effects of large ion clusters are substantial, but are limited to a very shallow surface region. This makes gas cluster ions effective for a variety of surface modification processes, but without the tendency to produce deeper sub-surface damage that is characteristic of conventional ion beam processing.

Conventional cluster ion sources produce cluster ions having a wide size distribution scaling with the number of molecules in each cluster that may reach several thousand molecules. Clusters of atoms can be formed by the condensation of individual gas atoms (or molecules) during the adiabatic expansion of high pressure gas from a nozzle into a vacuum. A skimmer with a small aperture strips divergent streams from the core of this expanding gas flow to produce a collimated beam of clusters. Neutral clusters of various sizes are produced and held together by weak inter-atomic forces known as Van der Waals forces. This method has been used to produce beams of clusters from a variety of gases, such as helium, neon, argon, krypton, xenon, nitrogen, oxygen, carbon dioxide, sulfur hexafluoride, nitric oxide, nitrous oxide, and mixtures of these gases.

Several emerging applications for GCIB processing of substrates on an industrial scale are in the semiconductor field. Although GCIB processing of a substrate is performed using a wide variety of gas-cluster source gases, many of which are inert gases, many semiconductor processing applications use reactive source gases, sometimes in combination or mixture with inert or noble gases, to form the GCIB.

SUMMARY OF THE INVENTION

The present invention relates to a method for depositing a thin film using a gas cluster ion beam (GCIB).

According to one embodiment, the method comprises maintaining a reduced-pressure environment around a substrate holder for holding a substrate having a surface, and holding the substrate securely within the reduced-pressure environment. Additionally, the method comprises providing to the reduced-pressure environment a gas cluster ion beam (GCIB) from a pressurized gas mixture comprising a silicon-containing specie and at least one of a nitrogen-containing specie or a carbon-containing specie, accelerating the GCIB, and irradiating the accelerated GCIB onto at least a portion of the surface of the substrate to form a thin film containing silicon and at least one of nitrogen or carbon.

According to another embodiment, the method comprises maintaining a reduced-pressure environment around a substrate holder for holding a substrate having a surface, and holding the substrate securely within the reduced-pressure environment. Additionally, the method comprises providing to the reduced-pressure environment a gas cluster ion beam (GCIB) from a pressurized gas mixture comprising a metal-containing specie, accelerating the GCIB, and irradiating the accelerated GCIB onto at least a portion of the surface of the substrate to form a thin metal-containing film.

According to yet another embodiment, the method comprises maintaining a reduced-pressure environment around a substrate holder for holding a substrate having a surface, and holding the substrate securely within the reduced-pressure environment. Additionally, the method comprises providing to the reduced-pressure environment a gas cluster ion beam (GCIB) from a pressurized gas mixture comprising a fluorocarbon-containing specie, accelerating the GCIB, and irradiating the accelerated GCIB onto at least a portion of the surface of the substrate to form a thin fluorocarbon-containing film.

DETAILED DESCRIPTION OF SEVERAL EMBODIMENTS

A method and system for performing directional deposition on a substrate using a gas cluster ion beam (GCIB) is disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

In the description and claims, the terms "coupled" and "connected," along with their derivatives, are used. It should be understood that these terms are not intended as synonyms for each other. Rather, in particular embodiments, "connected" may be used to indicate that two or more elements are in direct physical or electrical contact with each other while "coupled" may further mean that two or more elements are not in direct contact with each other, but yet still co-operate or interact with each other.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

There is a general need for selectively depositing material on only chosen surfaces of a substrate using a GCIB. By adjusting the orientation of the substrate relative to the GCIB, material deposition can proceed on surfaces that are substantially perpendicular to the incident GCIB while material deposition can be avoided or reduced on surfaces that are substantially parallel with the incident GCIB. Moreover, one or more properties of the GCIB, including the beam composition, can be adjusted or alternated in order to directionally deposit successive material films having differing properties from one layer to an adjacent layer.

Figure 1:
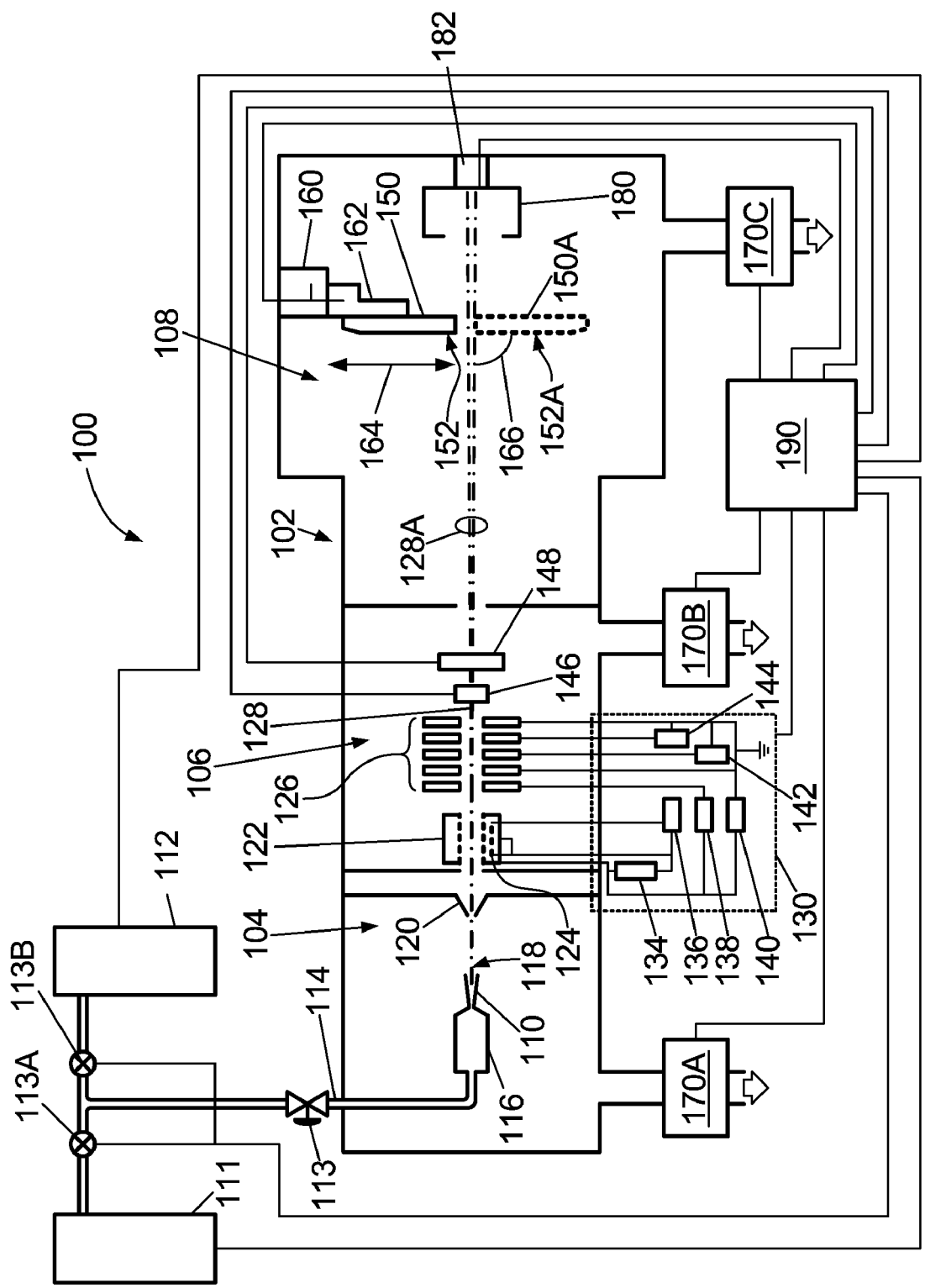
FIG. 1 is an illustration of a GCIB processing system.

According to one embodiment, a GCIB processing system 100 is depicted in FIG. 1 comprising a vacuum vessel 102, substrate holder 150, upon which a substrate 152 to be processed is affixed, and vacuum pumping systems 170A, 170B, and 170C. Substrate 152 can be a semiconductor substrate, a wafer, a flat panel display (FPD), a liquid crystal display (LCD), or any other workpiece. GCIB processing system 100 is configured to produce a GCIB for treating substrate 152.

Referring still to GCIB processing system 100 in FIG. 1, the vacuum vessel 102 comprises three communicating chambers, namely, a source chamber 104, an ionization/acceleration chamber 106, and a processing chamber 108 to provide a reduced-pressure enclosure. The three chambers are evacuated to suitable operating pressures by vacuum pumping systems 170A, 170B, and 170C, respectively. In the three communicating chambers 104, 106, 108, a gas cluster beam can be formed in the first chamber (source chamber 104), while a gas cluster ion beam (GCIB) can be formed in the second chamber (ionization/acceleration chamber 106) wherein the gas cluster beam is ionized and optionally accelerated, and then in the third chamber (processing chamber 108) the accelerated or non-accelerated GCIB may be utilized to treat substrate 152.

As shown in FIG. 1, GCIB processing system 100 can comprise one or more gas sources configured to introduce one or more gases or mixture of gases to vacuum vessel 102. For example, a first gas composition stored in a first gas source 111 is admitted under pressure through a first gas control valve 113A to a gas metering valve or valves 113. Additionally, for example, a second gas composition stored in a second gas source 112 is admitted under pressure through a second gas control valve 113B to the gas metering valve or valves 113. Furthermore, for example, the first gas composition or the second gas composition or both can comprise a film forming gas composition. Further yet, for example, the first gas composition or second gas composition or both can include a condensable inert gas, carrier gas or dilution gas. For example, the inert gas, carrier gas or dilution gas can include a noble gas, i.e., He, Ne, Ar, Kr, Xe, or Rn.

The film forming composition can comprise a film precursor or precursors that include the principal atomic or molecular species of the film desired to be produced on the substrate. Additionally, the film forming composition can include a reducing agent that assists with the reduction of a film precursor on a substrate. For instance, the reducing agent or agents may react with a part of or all of a film precursor on the substrate. Additionally yet, the film forming composition can include a polymerizing agent that may assist with the polymerization of a film precursor on the substrate.

The first gas source 111 and the second gas source 112 can each include one or more material sources configured to introduce a film forming composition. For example, the film forming composition may include one or more gases, or one or more vapors formed in one or more gases, or a mixture of two or more thereof. A material source may include a gas stored under high pressure, or one or more vaporization sources operable at high pressure, or a combination thereof. For example, a vaporization source can include a bubbler chamber configured to hold a liquid precursor, wherein a carrier gas (at the desired pressure) is "bubbled" through the liquid precursor while the liquid precursor is heated. Alternatively, for example, a vaporization source can include a solid precursor ampoule configured to hold solid precursor, wherein a carrier gas (at the desired pressure) is passed through or over the solid precursor while the solid precursor is heated. Herein vaporization refers to the transformation of a material (normally stored in a state other than a gaseous state) from a non-gaseous state to a gaseous state. Therefore, the terms "vaporization," "sublimation" and "evaporation" are used interchangeably herein to refer to the general formation of a vapor (gas) from a solid or liquid precursor, regardless of whether the transformation is, for example, from solid to liquid to gas, solid to gas, or liquid to gas.

The high pressure, condensable gas comprising the first gas composition or the second gas composition or both is introduced through gas feed tube 114 into stagnation chamber 116 and is ejected into the substantially lower pressure vacuum through a properly shaped nozzle 110. As a result of the expansion of the high pressure, condensable gas from the stagnation chamber 116 to the lower pressure region of the source chamber 104, the gas velocity accelerates to supersonic speeds and gas jet 118 emanates from nozzle 110.

The inherent cooling of the jet as static enthalpy is exchanged for kinetic energy, which results from the expansion in the jet, causes a portion of the gas jet 118 to condense and form clusters, each consisting of from several to several thousand weakly bound atoms or molecules. A gas skimmer 120, positioned downstream from the exit of the nozzle 110 between the source chamber 104 and ionization/acceleration chamber 106, partially separates the gas molecules on the peripheral edge of the gas jet 118, that may not have condensed into a cluster, from the gas molecules in the core of the gas jet 118, that may have formed clusters. Among other reasons, this selection of a portion of gas jet 118 can lead to a reduction in the pressure in the downstream regions where higher pressures may be detrimental (e.g., ionizer 122, and processing chamber 108). Furthermore, gas skimmer 120 defines an initial dimension for the gas cluster beam entering the ionization/acceleration chamber 106.

After the gas jet 118 has been formed in the source chamber 104, the constituent gas clusters in gas jet 118 are ionized by ionizer 122 to form GCIB 128. The ionizer 122 may include an electron impact ionizer that produces electrons from one or more filaments 124, which are accelerated and directed to collide with the gas clusters in the gas jet 118 inside the ionization/acceleration chamber 106. Upon collisional impact with the gas cluster, electrons of sufficient energy eject electrons from molecules in the gas clusters to generate ionized molecules. The ionization of gas clusters can lead to a population of charged gas cluster ions, generally having a net positive charge.

As shown in FIG. 1, beam electronics 130 are utilized to ionize, extract, accelerate, and focus the GCIB 128. The beam electronics 130 include a filament power supply 136 that provides voltage $V_F$ to heat the ionizer filament 124.

Additionally, the beam electronics 130 include a set of suitably biased high voltage electrodes 126 in the ionization/acceleration chamber 106 that extracts the cluster ions from the ionizer 122. The high voltage electrodes 126 then accelerate the extracted cluster ions to a desired energy and focus them to define GCIB 128. The kinetic energy of the cluster ions in GCIB 128 typically ranges from about 1000 electron volts (1 keV) to several tens of keV. For example, GCIB 128 can be accelerated to 1 to 70 kV.

As illustrated in FIG. 1, the beam electronics 130 further include an anode power supply 134 that provides voltage $V_A$ to an anode of ionizer 122 for accelerating electrons emitted from filament 124 and causing the electrons to bombard the gas clusters in gas jet 118, which produces cluster ions.

Additionally, as illustrated in FIG. 1, the beam electronics 130 include an extraction power supply 138 that provides voltage $V_E$ to bias at least one of the high voltage electrodes 126 to extract ions from the ionizing region of ionizer 122 and to form the GCIB 128. For example, extraction power supply 138 provides a voltage to a first electrode of the high voltage electrodes 126 that is less than or equal to the anode voltage of ionizer 122.

Furthermore, the beam electronics 130 can include an accelerator power supply 140 that provides voltage $V_{Acc}$ to bias one of the high voltage electrodes 126 with respect to the ionizer 122 so as to result in a total GCIB acceleration energy equal to about $V_{Acc}$ electron volts (eV). For example, accelerator power supply 140 provides a voltage to a second electrode of the high voltage electrodes 126 that is less than or equal to the anode voltage of ionizer 122 and the extraction voltage of the first electrode.

Further yet, the beam electronics 130 can include lens power supplies 142, 144 that may be provided to bias some of the high voltage electrodes 126 with potentials (e.g., $V_{L1}$ and $V_{L2}$) to focus the GCIB 128. For example, lens power supply 142 can provide a voltage to a third electrode of the high voltage electrodes 126 that is less than or equal to the anode voltage of ionizer 122, the extraction voltage of the first electrode, and the accelerator voltage of the second electrode, and lens power supply 144 can provide a voltage to a fourth electrode of the high voltage electrodes 126 that is less than or equal to the anode voltage of ionizer 122, the extraction voltage of the first electrode, the accelerator voltage of the second electrode, and the first lens voltage of the third electrode. A beam filter 146 in the ionization/acceleration chamber 106 downstream of the high voltage electrodes 126 can be utilized to eliminate monomers, or monomers and light cluster ions from the GCIB 128 to define a filtered process GCIB 128A that enters the processing chamber 108. In one embodiment, the beam filter 146 substantially reduces the number of gas clusters having 100 or less atoms or molecules or both.

Referring still to FIG. 1, a beam gate 148 is disposed in the path of GCIB 128 in the ionization/acceleration chamber 106. Beam gate 148 has an open state in which the GCIB 128 is permitted to pass from the ionization/acceleration chamber 106 to the processing chamber 108 to define process GCIB 128A, and a closed state in which the GCIB 128 is blocked from entering the processing chamber 108. A control cable conducts control signals from control system 190 to beam gate 148. The control signals controllably switch beam gate 148 between the open or closed states.

A substrate 152, which may be a wafer or semiconductor wafer, a flat panel display (FPD), a liquid crystal display (LCD), or other substrate to be processed by GCIB processing, is disposed in the path of the process GCIB 128A in the processing chamber 108. Because most applications contemplate the processing of large substrates with spatially uniform results, a scanning system may be desirable to uniformly scan the process GCIB 128A across large areas to produce spatially homogeneous results.

An X-scan actuator 160 provides linear motion of the substrate holder 150 in the direction of X-scan motion (into and out of the plane of the paper). A Y-scan actuator 162 provides linear motion of the substrate holder 150 in the direction of Y-scan motion 164, which is typically orthogonal to the X-scan motion. The combination of X-scanning and Y-scanning motions translates the substrate 152, held by the substrate holder 150, in a raster-like scanning motion through process GCIB 128A to cause a uniform (or otherwise programmed) irradiation of a surface of the substrate 152 by the process GCIB 128A for processing of the substrate 152.

The substrate holder 150 disposes the substrate 152 at an angle with respect to the axis of the process GCIB 128A so that the process GCIB 128A has an angle of beam incidence 166 with respect to a substrate 152 surface. The angle of beam incidence 166 may be 90 degrees or some other angle, but is typically 90 degrees or near 90 degrees. During Y-scanning, the substrate 152 and the substrate holder 150 move from the shown position to the alternate position "A" indicated by the designators 152A and 150A, respectively. Notice that in moving between the two positions, the substrate 152 is scanned through the process GCIB 128A, and in both extreme positions, is moved completely out of the path of the process GCIB 128A (over-scanned). Though not shown explicitly in FIG. 1, similar scanning and over-scan is performed in the (typically) orthogonal X-scan motion direction (in and out of the plane of the paper).

A beam current sensor 180 may be disposed beyond the substrate holder 150 in the path of the process GCIB 128A so as to intercept a sample of the process GCIB 128A when the substrate holder 150 is scanned out of the path of the process GCIB 128A. The beam current sensor 180 is typically a faraday cup or the like, closed except for a beam-entry opening, and is typically affixed to the wall of the vacuum vessel 102 with an electrically insulating mount 182.

As shown in FIG. 1, control system 190 connects to the X-scan actuator 160 and the Y-scan actuator 162 through electrical cable and controls the X-scan actuator 160 and the Y-scan actuator 162 in order to place the substrate 152 into or out of the process GCIB 128A and to scan the substrate 152 uniformly relative to the process GCIB 128A to achieve desired processing of the substrate 152 by the process GCIB 128A. Control system 190 receives the sampled beam current collected by the beam current sensor 180 by way of an electrical cable and, thereby, monitors the GCIB and controls the GCIB dose received by the substrate 152 by removing the substrate 152 from the process GCIB 128A when a predetermined dose has been delivered.

Figure 2:
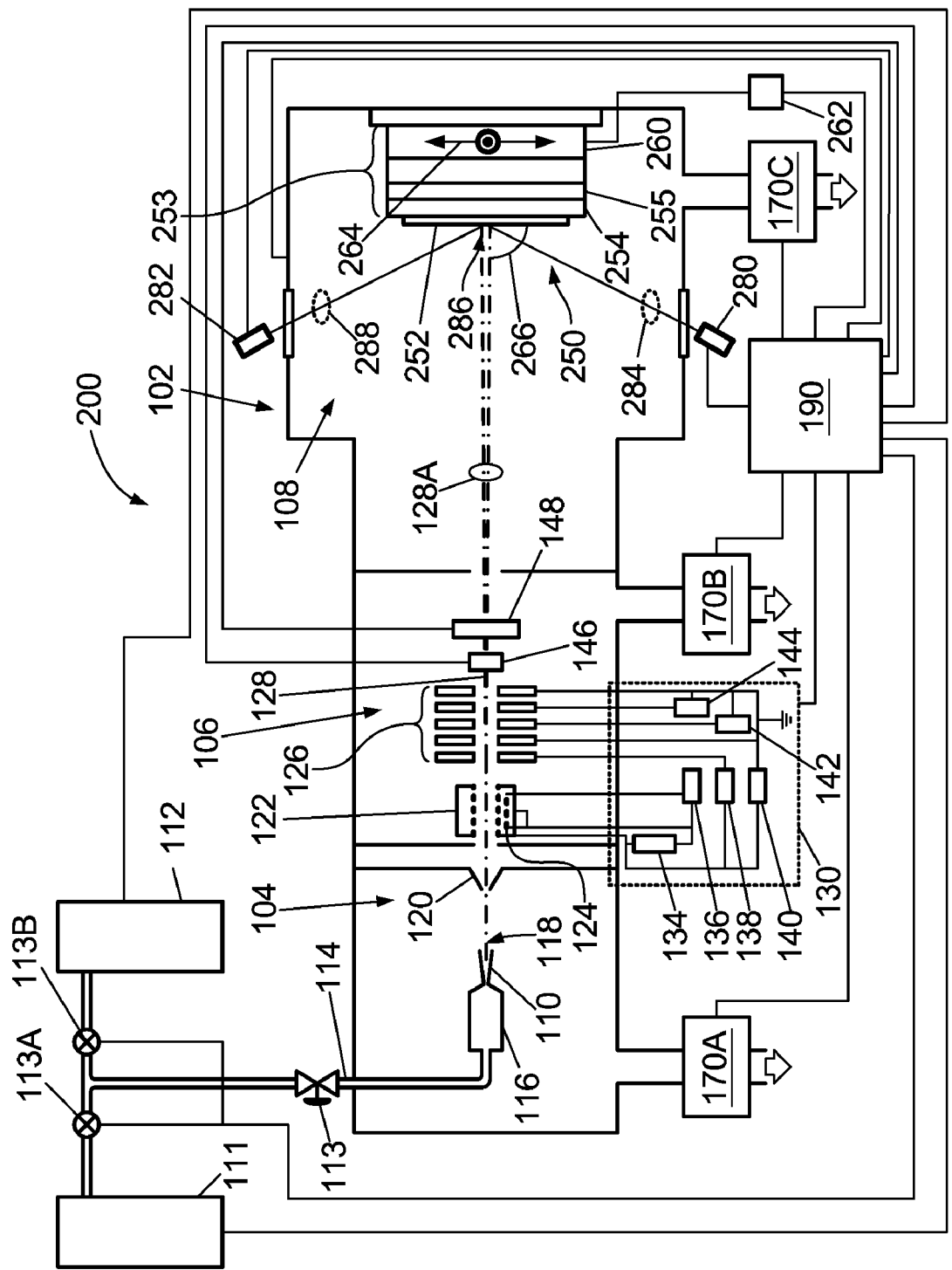
FIG. 2 is another illustration of a GCIB processing system.

In the embodiment shown in FIG. 2, the GCIB processing system 200 can be similar to the embodiment of FIG. 1 and further comprise a X-Y positioning table 253 operable to hold and move a substrate 252 in two axes, effectively scanning the substrate 252 relative to the process GCIB 128A. For example, the X-motion can include motion into and out of the plane of the paper, and the Y-motion can include motion along direction 264.

The process GCIB 128A impacts the substrate 252 at a projected impact region 286 on a surface of the substrate 252, and at an angle of beam incidence 266 with respect to the substrate 252 surface. By X-Y motion, the X-Y positioning table 253 can position each portion of a surface of the substrate 252 in the path of process GCIB 128A so that every region of the surface may be made to coincide with the projected impact region 286 for processing by the process GCIB 128A. An X-Y controller 262 provides electrical signals to the X-Y positioning table 253 through an electrical cable for controlling the position and velocity in each of X-axis and Y-axis directions. The X-Y controller 262 receives control signals from, and is operable by, control system 190 through an electrical cable. X-Y positioning table 253 moves by continuous motion or by stepwise motion according to conventional X-Y table positioning technology to position different regions of the substrate 252 within the projected impact region 286. In one embodiment, X-Y positioning table 253 is programmably operable by the control system 190 to scan, with programmable velocity, any portion of the substrate 252 through the projected impact region 286 for GCIB processing by the process GCIB 128A.

The substrate holding surface 254 of positioning table 253 is electrically conductive and is connected to a dosimetry processor operated by control system 190. An electrically insulating layer 255 of positioning table 253 isolates the substrate 252 and substrate holding surface 254 from the base portion 260 of the positioning table 253. Electrical charge induced in the substrate 252 by the impinging process GCIB 128A is conducted through substrate 252 and substrate holding surface 254, and a signal is coupled through the positioning table 253 to control system 190 for dosimetry measurement. Dosimetry measurement has integrating means for integrating the GCIB current to determine a GCIB processing dose. Under certain circumstances, a target-neutralizing source (not shown) of electrons, sometimes referred to as electron flood, may be used to neutralize the process GCIB 128A. In such case, a Faraday cup (not shown) may be used to assure accurate dosimetry despite the added source of electrical charge.

In operation, the control system 190 signals the opening of the beam gate 148 to irradiate the substrate 252 with the process GCIB 128A. The control system 190 monitors measurements of the GCIB current collected by the substrate 252 in order to compute the accumulated dose received by the substrate 252. When the dose received by the substrate 252 reaches a predetermined dose, the control system 190 closes the beam gate 148 and processing of the substrate 252 is complete. Based upon measurements of the GCIB dose received for a given area of the substrate 252, the control system 190 can adjust the scan velocity in order to achieve an appropriate beam dwell time to deposit material to a desired local thickness effective to provide a film of substantially uniform thickness or a film having a thickness substantially equivalent to a pre-determined thickness profile.

Alternatively, the process GCIB 128A may be scanned at a constant velocity in a fixed pattern across the surface of the substrate 252; however, the GCIB intensity is modulated (may be referred to as Z-axis modulation) to deliver an intentionally non-uniform dose to the sample. The GCIB intensity may be modulated in the GCIB processing system 200 by any of a variety of methods, including varying the gas flow from a GCIB source supply; modulating the ionizer 122 by either varying a filament voltage $V_F$ or varying an anode voltage $V_A$; modulating the lens focus by varying lens voltages $V_{L1}$ and/or $V_{L2}$; or mechanically blocking a portion of the gas cluster ion beam with a variable beam block, adjustable shutter, or variable aperture. The modulating variations may be continuous analog variations or may be time modulated switching or gating.

The processing chamber 108 may further include an in-situ metrology system. For example, the in-situ metrology system may include an optical diagnostic system having an optical transmitter 280 and optical receiver 282 configured to illuminate substrate 252 with an incident optical signal 284 and to receive a scattered optical signal 288 from substrate 252, respectively. The optical diagnostic system comprises optical windows to permit the passage of the incident optical signal 284 and the scattered optical signal 288 into and out of the processing chamber 108. Furthermore, the optical transmitter 280 and the optical receiver 282 may comprise transmitting and receiving optics, respectively. The optical transmitter 280 receives, and is responsive to, controlling electrical signals from the control system 190. The optical receiver 282 returns measurement signals to the control system 190.

The in-situ metrology system may comprise any instrument configured to monitor the progress of the GCIB processing. According to one embodiment, the in-situ metrology system may constitute an optical scatterometry system. The scatterometry system may include a scatterometer, incorporating beam profile ellipsometry (ellipsometer) and beam profile reflectometry (reflectometer), commercially available from Therma-Wave, Inc. (1250 Reliance Way, Fremont, Calif. 94539) or Nanometrics, Inc. (1550 Buckeye Drive, Milpitas, Calif. 95035).

For instance, the in-situ metrology system may include an integrated Optical Digital Profilometry (iODP) scatterometry module configured to measure process performance data resulting from the execution of a treatment process in the GCIB processing system 200. The metrology system may, for example, measure or monitor metrology data resulting from the treatment process. The metrology data can, for example, be utilized to determine process performance data that characterizes the treatment process, such as a process rate, a relative process rate, a feature profile angle, a critical dimension, a feature thickness or depth, a feature shape, etc. For example, in a process for directionally depositing material on a substrate, process performance data can include a critical dimension (CD), such as a top, middle or bottom CD in a feature (i.e., via, line, etc.), a feature depth, a material thickness, a sidewall angle, a sidewall shape, a deposition rate, a relative deposition rate, a spatial distribution of any parameter thereof, a parameter to characterize the uniformity of any spatial distribution thereof, etc. Operating the X-Y positioning table 253 via control signals from control system 190, the in-situ metrology system can map one or more characteristics of the substrate 252.

Control system 190 comprises a microprocessor, memory, and a digital I/O port capable of generating control voltages sufficient to communicate and activate inputs to GCIB processing system 100 (or 200) as well as monitor outputs from GCIB processing system 100 (or 200). Moreover, control system 190 can be coupled to and can exchange information with vacuum pumping systems 170A, 170B, and 170C, first gas source 111, second gas source 112, first gas control valve 113A, second gas control valve 113B, beam electronics 130, beam filter 146, beam gate 148, the X-scan actuator 160, the Y-scan actuator 162, and beam current sensor 180. For example, a program stored in the memory can be utilized to activate the inputs to the aforementioned components of GCIB processing system 100 according to a process recipe in order to perform a GCIB process on substrate 152. One example of control system 190 is a DELL PRECISION WORKSTATION 610™, available from Dell Corporation, Austin, Tex.

However, the control system 190 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The control system 190 can be used to configure any number of processing elements, as described above, and the control system 190 can collect, provide, process, store, and display data from processing elements. The control system 190 can include a number of applications, as well as a number of controllers, for controlling one or more of the processing elements. For example, control system 190 can include a graphic user interface (GUI) component (not shown) that can provide interfaces that enable a user to monitor and/or control one or more processing elements.

Control system 190 can be locally located relative to the GCIB processing system 100 (or 200), or it can be remotely located relative to the GCIB processing system 100 (or 200). For example, control system 190 can exchange data with GCIB processing system 100 using a direct connection, an intranet, and/or the internet. Control system 190 can be coupled to an intranet at, for example, a customer site (i.e., a device maker, etc.), or it can be coupled to an intranet at, for example, a vendor site (i.e., an equipment manufacturer). Alternatively or additionally, control system 190 can be coupled to the internet. Furthermore, another computer (i.e., controller, server, etc.) can access control system 190 to exchange data via a direct connection, an intranet, and/or the internet.

Furthermore, embodiments of this invention may be used as or to support a software program executed upon some form of processing core (such as a processor of a computer, e.g., control system 190) or otherwise implemented or realized upon or within a machine-readable medium. A machine-readable medium includes any mechanism for storing information in a form readable by a machine (e.g., a computer). For example, a machine-readable medium can include such as a read only memory (ROM); a random access memory (RAM); a magnetic disk storage media; an optical storage media; and a flash memory device, etc.

Substrate 152 (or 252) can be affixed to the substrate holder 150 (or substrate holder 250) via a clamping system (not shown), such as a mechanical clamping system or an electrical clamping system (e.g., an electrostatic clamping system). Furthermore, substrate holder 150 (or 250) can include a heating system (not shown) or a cooling system (not shown) that is configured to adjust and/or control the temperature of substrate holder 150 (or 250) and substrate 152 (or 252).

Vacuum pumping systems 170A, 170B, and 170C can include turbo-molecular vacuum pumps (TMP) capable of pumping speeds up to about 5000 liters per second (and greater) and a gate valve for throttling the chamber pressure. In conventional vacuum processing devices, a 1000 to 3000 liter per second TMP can be employed. TMPs are useful for low pressure processing, typically less than about 50 mTorr. Furthermore, a device for monitoring chamber pressure (not shown) can be coupled to the vacuum vessel 102 or any of the three vacuum chambers 104, 106, 108. The pressure-measuring device can be, for example, a capacitance manometer or ionization gauge.

Figure 3:
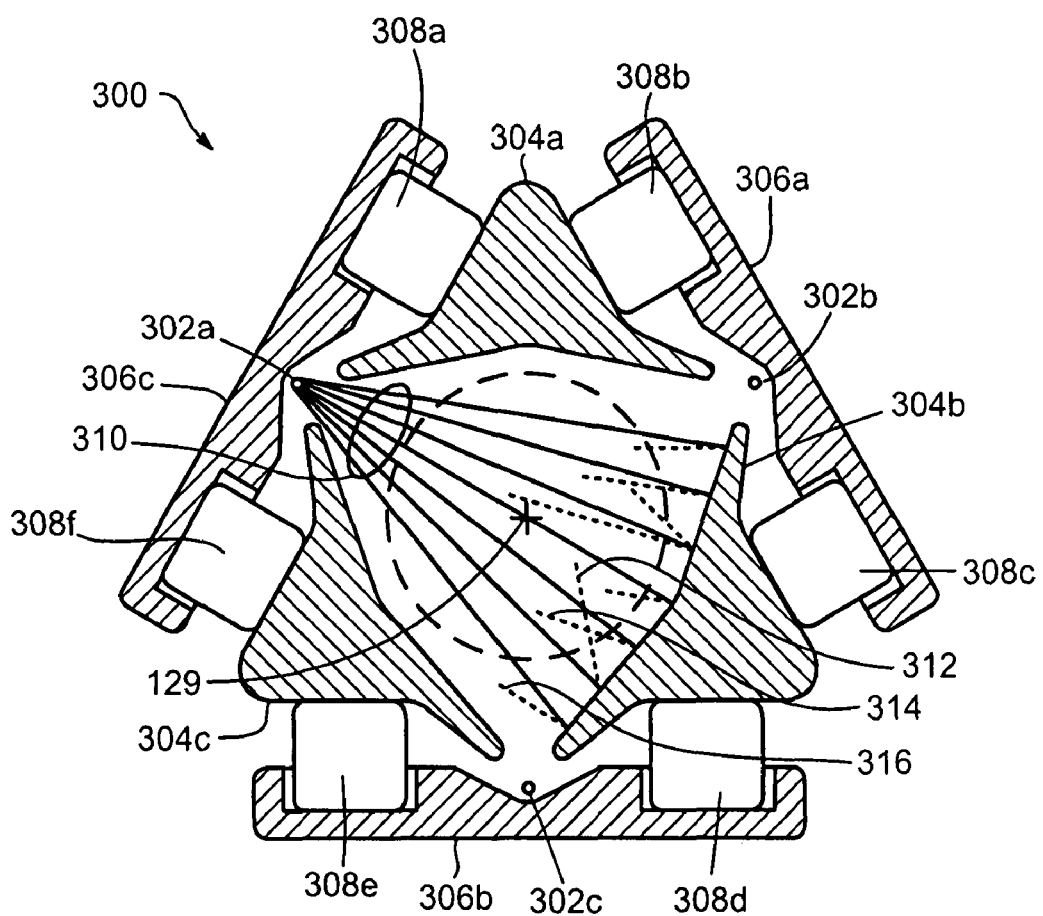
FIG. 3 is an illustration of an ionization source for a GCIB processing system.

Referring now to FIG. 3, a section 300 of a gas cluster ionizer (122, FIGS. 1 and 2) for ionizing a gas cluster jet (gas jet 118, FIGS. 1 and 2) is shown. The section 300 is normal to axis 129 of GCIB 128. For typical gas cluster sizes (2000 to 15000 atoms), clusters leaving the skimmer aperture (120, FIGS. 1 and 2) and entering an ionizer (122, FIGS. 1 and 2) will travel with a kinetic energy of about 130 to 1000 electron volts (eV). At these low energies, any departure from space charge neutrality within the ionizer 122 will result in a rapid dispersion of the jet with a significant loss of beam current. FIG. 3 illustrates a self-neutralizing ionizer. As with other ionizers, gas clusters are ionized by electron impact. In this design, thermo-electrons (seven examples indicated by 310) are emitted from multiple linear thermionic filaments 302*a*, 302*b*, and 302*c* (typically tungsten) and are extracted and focused by the action of suitable electric fields provided by electron-repeller electrodes 306*a*, 306*b*, and 306*c* and beam-forming electrodes 304*a*, 304*b*, and 304*c*. Thermo-electrons 310 pass through the gas cluster jet and the jet axis and then strike the opposite beam-forming electrode 304*b* to produce low energy secondary electrons (312, 314, and 316 indicated for examples).

Though (for simplicity) not shown, linear thermionic filaments 302*b* and 302*c* also produce thermo-electrons that subsequently produce low energy secondary electrons. All the secondary electrons help ensure that the ionized cluster jet remains space charge neutral by providing low energy electrons that can be attracted into the positively ionized gas cluster jet as required to maintain space charge neutrality. Beam-forming electrodes 304*a*, 304*b*, and 304*c* are biased positively with respect to linear thermionic filaments 302*a*, 302*b*, and 302*c* and electron-repeller electrodes 306*a*, 306*b*, and 306*c* are negatively biased with respect to linear thermionic filaments 302*a*, 302*b*, and 302*c*. Insulators 308*a*, 308*b*, 308*c*, 308*d*, 308*e*, and 308*f* electrically insulate and support electrodes 304*a*, 304*b*, 304*c*, 306*a*, 306*b*, and 306*c*. For example, this self-neutralizing ionizer is effective and achieves over 1000 micro Amps argon GCIBs.

According to an embodiment, a GCIB is utilized to selectively deposit material on only chosen surfaces of a substrate. For example, the GCIB can be provided using either of the GCIB processing systems (100 or 200, or combinations thereof) depicted in FIGS. 1 and 2. By orienting the substrate relative to the direction of incidence of the GCIB, material deposition can proceed on one or more surfaces that are substantially perpendicular to the incident GCIB while material deposition can be substantially avoided or reduced on one or more surfaces that are substantially parallel with the incident GCIB. Subsequently adjusting the orientation of the substrate relative to the direction of incidence of the GCIB will then permit deposition to proceed on other surfaces that are then oriented substantially perpendicular to the incident GCIB. Moreover, one or more properties of the GCIB, including the beam composition, can be adjusted or alternated in order to directionally deposit successive material films having differing properties from one layer to an adjacent layer on one or more surfaces substantially perpendicular to the incident GCIB.

Figure 4A:
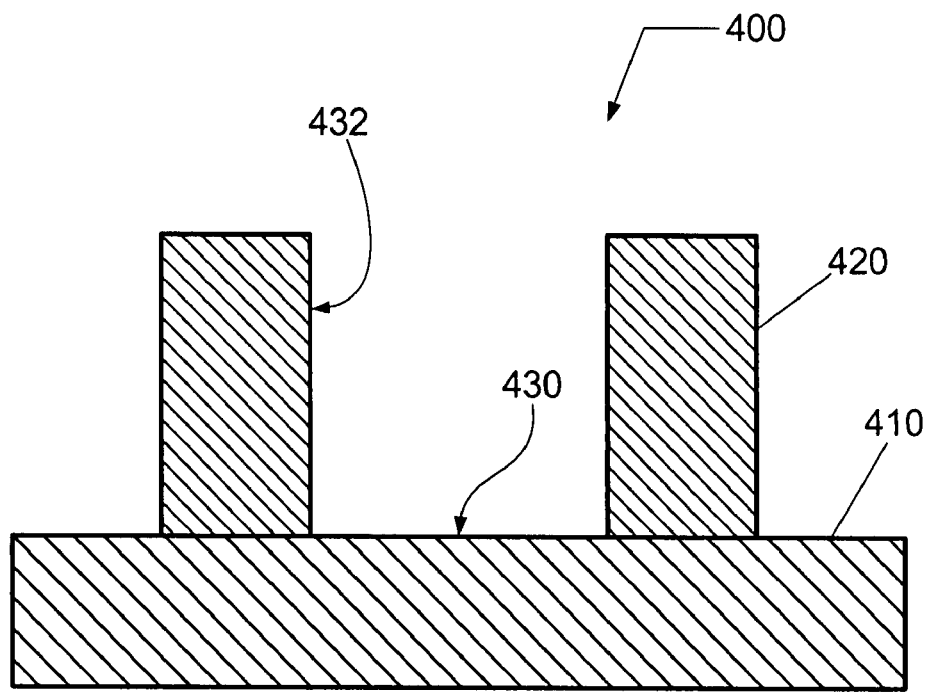
FIGS. 4A and 4B illustrate a method of directional deposition on a substrate according to an embodiment.
Figure 4B:
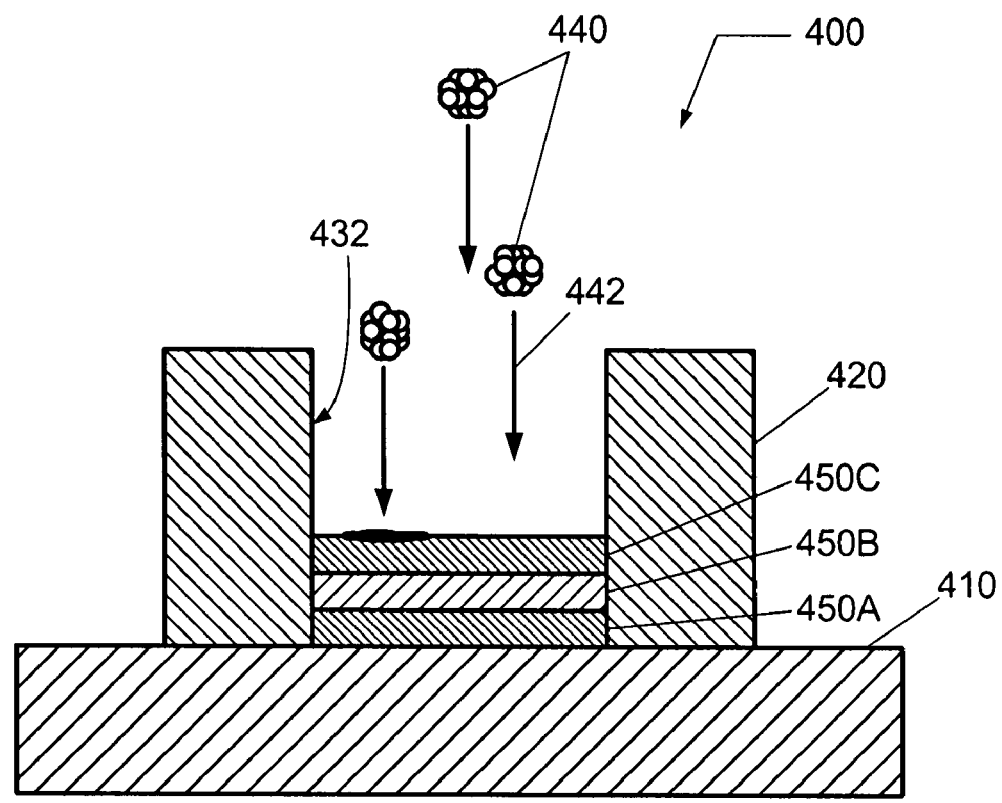
Figure 5:
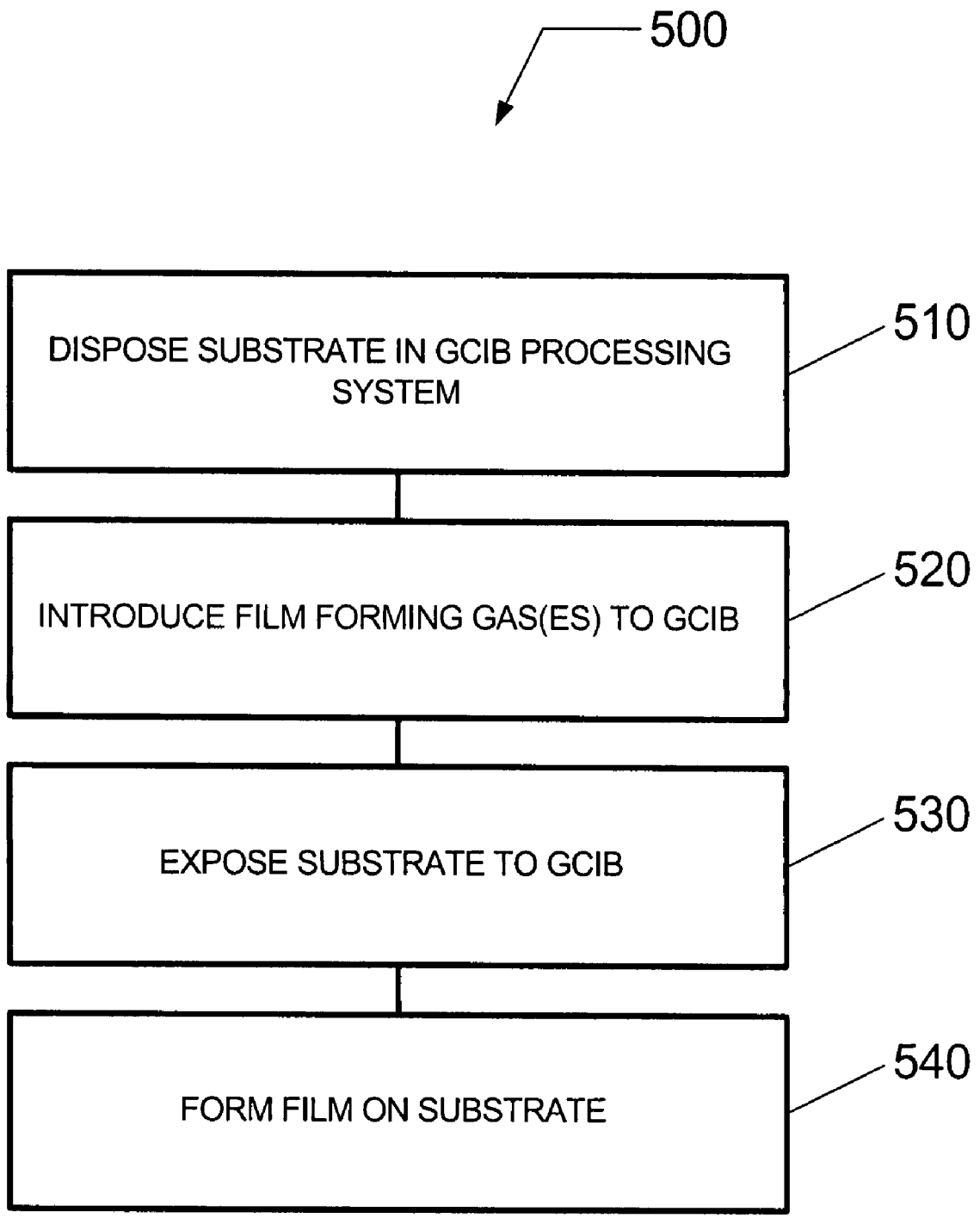
FIG. 5 illustrates a method of depositing a thin film on a substrate according to another embodiment.

Referring to FIGS. 4A and 4B, and FIG. 5, a method of depositing material on a substrate using a GCIB is illustrated according to an embodiment. The method comprises a flow chart 500 beginning in 510 with disposing a substrate in a GCIB processing system. The substrate can be positioned on a substrate holder and may be securely held by the substrate holder. The temperature of the substrate may or may not be controlled. For example, the substrate may be heated or cooled during a film forming process. The environment surrounding the substrate is maintained at a reduced pressure, while a GCIB is formed from a pressurized gas mixture comprising one or more film-forming species. The GCIB processing system can be any of the GCIB processing systems (100 or 200) described above in FIG. 1 or 2, or any combination thereof. The substrate can include a conductive material, a non-conductive material, or a semi-conductive material, or a combination of two or more materials thereof. Additionally, the substrate may include one or more structures formed thereon, or the substrate may be a blanket substrate free of material structures.

For example, as shown in FIG. 4A, a material structure 400 is shown comprising one or more structures 420 formed on or in a substrate 410. One or more layers, features and/or other structures may be formed on substrate 410 prior to the formation of the one or more structures 420. The one or more structures 420 may include any structure for preparing an electronic or mechanical device or electromechanical device on substrate 410, such as an integrated circuit (IC), a microelectromechanical (MEM) device, or a nano-electromechanical (NEM) device. Electronic devices may comprise any portion of an electronic device including, but not limited to, an interconnect structure, a transistor, or a capacitor. Mechanical devices may include, but not be limited to, a channel or conduit, a cantilever, or a column, or any combination thereof. For example, the one or more structures 420 can include a via, a contact, a trench, a capacitor trench, a gate stack, or a spacer, or any combination thereof. The one or more structures 420, formed in or on substrate 410, comprise one or more horizontal surfaces 430 that are substantially parallel with the substrate plane, and one or more vertical surfaces 432 that are substantially perpendicular with the substrate plane.

In 520, film-forming gas is introduced to the GCIB to produce a film-forming GCIB and, as illustrated in FIG. 4B, a plurality of gas clusters 440 are shown collectively moving together as the film-forming GCIB in a direction 442 towards the substrate 410. As described above, a pressurized gas mixture is expanded into a reduced pressure environment to form gas-clusters, the gas-clusters are ionized, and the ionized gas-clusters are accelerated and optionally filtered.

In 530, the substrate 410 is exposed to the film-forming GCIB and, as shown in FIG. 4B, the direction 442 of incidence of the GCIB is substantially perpendicular to the substrate plane. In 540, a film is formed on substrate 410 and, as shown in FIG. 4B, the impact of multiple gas clusters on the one or more horizontal surfaces 430 cause the formation of a deposited layer 450A on the one or more horizontal surfaces 430, while causing substantially insignificant formation of a deposited film on the one or more vertical surfaces 432. However, by adjusting the orientation of the substrate 410 (i.e., tilting the substrate) relative to the incident GCIB, film deposition can be achieved on the one or more vertical surfaces 432. By orienting the substrate 410, directional deposition can occur on any surface oriented to lie in a plane perpendicular to the direction of incidence of the GCIB.

As the gas clusters collide with the one or more horizontal surfaces 430, material is infused in the surface layer of substrate 410 or the underlying layer formed on substrate 410. As the GCIB dose is increased, the infusion of material transitions to the deposition of material on the surface of substrate 410. Amorphous films having a variety of material compositions can be produced, and anisotropic (or directional) deposition can be achieved using a GCIB. Once the amorphous film is formed, it may be subjected to one or more thermal cycles (e.g., elevation of temperature) in order to crystallize the film.

According to another embodiment, the directional deposition of one or more thin films (e.g., 450B, 450C, etc.) on a substrate using a GCIB is contemplated for numerous compositions. Film compositions can include silicon-containing films, such as films containing substantially Si; films containing Si and C; films containing Si and O; films containing Si and N; films containing Si, C and N; films containing Si, O and C; films containing Si, C and H; films containing Si, O, C and H; films containing Si, O and N; and films containing Si, O, C and N. For example, films resembling amorphous silicon, amorphous silicon carbide, amorphous silicon oxide, amorphous silicon nitride, amorphous silicon oxynitride, amorphous silicon carbonitride, amorphous silicon oxycarbonitride, etc., can be formed.

Additionally, film compositions can include germanium-containing films, such as films containing substantially Ge; and films containing Ge and Si. Film compositions can include boron-containing films, such as films containing substantially B; films containing B and N; films containing B and C; films containing Si and B; films containing Si, N and B; films containing Ge and B; films containing Si, Ge and B. Film compositions can include sulfur-containing films, phosphorus-containing films, or arsine-containing films. Furthermore, film compositions can include tungsten-containing films, such as films containing substantially W; films containing W and N; films containing W and C; films containing W and Si; films containing W, Si and N; films containing W, Si and O; films containing W, Si, N and O. Further yet, film compositions can include fluorocarbon-containing films, such as films containing substantially F and C.

When producing silicon-containing films, the silicon-containing specie can include silane ($SiH_4$), disilane ($Si_2H_6$), dichlorosilane ($SiH_2Cl_2$), trichlorosilane ($SiCl_3H$), diethylsilane ($C_4H_{12}Si$), trimethylsilane ($C_3H_{10}Si$), silicon tetrachloride ($SiCl_4$), silicon tetrafluoride ($SiF_4$), or a combination of two or more thereof.

When producing silicon-containing films, other species of the pressurized gas mixture can include a germanium-containing material, a carbon-containing material, an oxygen-containing material, a hydrogen-containing material, a nitrogen-containing material, a fluorine-containing material, a sulfur-containing material, a boron-containing material, a phosphorous-containing material, or an arsenic-containing material, or a combination of two or more thereof. For example, the pressurized gas mixture can further include $N_2$, $NH_3$, $NF_3$, $NO$, $N_2O$, $NO_2$, a hydrocarbon gas having the formula $C_xH_y$, wherein x and y are integers greater than or equal to unity, a fluorocarbon gas having the formula $C_xF_y$, wherein x and y are integers greater than or equal to unity, a hydrofluorocarbon gas having the formula $C_xH_yF_z$, wherein x, y and z are integers greater than or equal to unity, $H_2$, $O_2$, CO, $CO_2$, sulfur hexafluoride ($SF_6$), boron trifluoride ($BF_3$), diborane ($B_2H_6$), phosphine ($PH_3$), $PF_5$, arsine ($AsH_3$), $AsF_5$, germane ($GeH_4$), digermane ($Ge_2H_6$), dichlorogermane ($GeH_2Cl_2$), trichlorogermane ($GeCl_3H$), diethylgermane ($C_4H_{12}Ge$), trimethylgermane ($C_3H_{10}Ge$), germanium tetrachloride ($GeCl_4$), germanium tetrafluoride ($GeF_4$), or a noble gas, or a combination of two or more thereof.

According to one example, a film containing Si is deposited using the introduction of silane ($SiH_4$) to a GCIB.

According to one example, a film containing Si and N is deposited using the introduction of silane ($SiH_4$), and a nitrogen-containing gas such as $N_2$ or $NH_3$ to a GCIB.

According to another example, a film containing Si and O is deposited using the introduction of silicon tetrafluoride ($SiF_4$), and an oxygen-containing gas such as $O_2$ to a GCIB.

According to another example, a film containing Si, O and N is deposited using the introduction of silicon tetrafluoride ($SiF_4$), an oxygen-containing gas such as $O_2$, and a nitrogen-containing gas such as $N_2$ or $NH_3$ to a GCIB. Alternatively, the oxygen-containing gas and the nitrogen-containing gas can include NO, $NO_2$, or $N_2O$, or a combination of two or more thereof.

According to another example, a film containing Si and C is deposited using the introduction of silane ($SiH_4$), and a hydrocarbon gas ($C_xH_y$) such as methane ($CH_4$) to a GCIB. Alternatively, the introduction of diethylsilane or trimethylsilane to a GCIB can be utilized.

According to another example, a film containing Si, H and C is deposited using the introduction of silane ($SiH_4$), and a hydrocarbon gas ($C_xH_y$) such as methane ($CH_4$) to a GCIB. Alternatively, the introduction of diethylsilane or trimethylsilane to a GCIB can be utilized.

According to another example, a film containing Si, O and C is deposited using the introduction of silicon tetrafluoride ($SiF_4$), an oxygen-containing gas such as $O_2$, and methane ($CH_4$) to a GCIB. Alternatively, other carbon-containing gases may include CO and $CO_2$.

According to another example, a film containing Si, O, N and C is deposited using the introduction of silicon tetrafluoride ($SiF_4$), an oxygen-containing gas such as $O_2$, a nitrogen-containing gas such as $N_2$ or $NH_3$, and methane ($CH_4$) to a GCIB.

According to yet another example, a film containing Si, C and F is deposited using the introduction of silicon tetrafluoride ($SiF_4$), and a carbon-containing gas such as methane ($CH_4$) or carbon tetrafluoride ($CF_4$) to a GCIB.

When producing germanium-containing films, the germanium-containing specie can include germane ($GeH_4$), digermane ($Ge_2H_6$), dichlorogermane ($GeH_2Cl_2$), trichlorogermane ($GeCl_3H$), diethylgermane ($C_4H_{12}Ge$), trimethylgermane ($C_3H_{10}Ge$), germanium tetrachloride ($GeCl_4$), germanium tetrafluoride ($GeF_4$), or a combination of two or more thereof.

When producing germanium-containing films, other species of the pressurized gas mixture can include a silicon-containing material, a carbon-containing material, an oxygen-containing material, a hydrogen-containing material, a nitrogen-containing material, a fluorine-containing material, a sulfur-containing material, a boron-containing material, a phosphorous-containing material, or an arsenic-containing material, or a combination of two or more thereof. For example, the pressurized gas mixture can further include $N_2$, $NH_3$, $NF_3$, NO, $N_2O$, $NO_2$, a hydrocarbon gas having the formula $C_xH_y$, wherein x and y are integers greater than or equal to unity, a fluorocarbon gas having the formula $C_xF_y$, wherein x and y are integers greater than or equal to unity, a hydrofluorocarbon gas having the formula $C_xH_yF_z$, wherein x, y and z are integers greater than or equal to unity, $H_2$, $O_2$, CO, $CO_2$, sulfur hexafluoride ($SF_6$), boron trifluoride ($BF_3$), diborane ($B_2H_6$), phosphine ($PH_3$), $PF_5$, arsine ($AsH_3$), $AsF_5$, or a noble gas, or a combination of two or more thereof.

According to another example, films containing Ge can be deposited using the introduction of germane ($GeH_4$) to a GCIB. Additionally, SiGe films can be produced using the introduction of silane and germane to a GCIB.

According to yet another example, a film containing B is deposited using the introduction of diborane ($B_2H_6$) or boron trifluoride ($BF_3$) to a GCIB.

According to another example, a film containing B and N is deposited using the introduction of diborane ($B_2H_6$) and a nitrogen-containing gas such as $N_2$ or $NH_3$ to a GCIB.

According to another example, a film containing B and C is deposited using the introduction of trimethyl boron to a GCIB.

According to another embodiment, a film containing Si and B is deposited using the introduction of silane ($SiH_4$) and diborane ($B_2H_6$) to a GCIB.

According to another embodiment, a film containing Si, N and B is deposited using the introduction of silane ($SiH_4$), a nitrogen-containing gas such as $N_2$ or $NH_3$, and diborane ($B_2H_6$) to a GCIB.

According to another embodiment, a film containing Ge and B is deposited using the introduction of germane ($GeH_4$) and diborane ($B_2H_6$) to a GCIB.

According to another embodiment, a film containing Ge, N and B is deposited using the introduction of germane ($GeH_4$), a nitrogen-containing gas such as $N_2$ or $NH_3$, and diborane ($B_2H_6$) to a GCIB.

Other boron-containing film precursors can include boron fluoride, such as boron trifluoride ($BF_3$) or diborane tetrafluoride ($B_2F_4$); boron chloride, such as boron trichloride ($BCl_3$) or diborane tetrachloride ($B_2Cl_4$); or other boron hydrides, such as tetraborane ($B_4H_{10}$).

According to yet another embodiment, a film containing F and C is deposited using the introduction of a fluorocarbon gas ($C_xF_y$) or fluorohydrocarbon gas ($C_xF_yH_z$) to a GCIB.

When producing metal-containing films, the metal-containing specie can include a tungsten-containing specie, such as tungsten hexafluoride ($WF_6$).

When producing metal-containing films, other species of the pressurized gas mixture can include a silicon-containing material, a carbon-containing material, an oxygen-containing material, a hydrogen-containing material, a nitrogen-containing material, a fluorine-containing material, a sulfur-containing material, a boron-containing material, a phosphorous-containing material, or an arsenic-containing material, or a combination of two or more thereof. For example, the pressurized gas mixture can further include $N_2$, $NH_3$, $NF_3$, NO, $N_2O$, $NO_2$, a hydrocarbon gas having the formula $C_xH_y$, wherein x and y are integers greater than or equal to unity, a fluorocarbon gas having the formula $C_xF_y$, wherein x and y are integers greater than or equal to unity, a hydrofluorocarbon gas having the formula $C_xH_yF_z$, wherein x, y and z are integers greater than or equal to unity, $H_2$, $O_2$, CO, $CO_2$, silane ($SiH_4$), disilane ($Si_2H_6$), dichlorosilane ($SiH_2Cl_2$), trichlorosilane ($SiCl_3H$), diethylsilane ($C_4H_{12}Si$), trimethylsilane ($C_3H_{10}Si$), silicon tetrachloride ($SiCl_4$), silicon tetrafluoride ($SiF_4$), germane ($GeH_4$), digermane ($Ge_2H_6$), dichlorogermane ($GeH_2Cl_2$), trichlorogermane ($GeCl_3H$), diethylgermane ($C_4H_{12}Ge$), trimethylgermane ($C_3H_{10}Ge$), germanium tetrachloride ($GeCl_4$), germanium tetrafluoride ($GeF_4$), sulfur hexafluoride ($SF_6$), boron trifluoride ($BF_3$), diborane ($B_2H_6$), phosphine ($PH_3$), $PF_5$, arsine ($AsH_3$), $AsF_5$, or a noble gas, or a combination of two or more thereof.

According to an example, a film containing W is deposited using the introduction of tungsten hexafluoride ($WF_6$) to a GCIB.

According to another example, a film containing W and N is deposited using the introduction of tungsten hexafluoride ($WF_6$) and a nitrogen-containing gas such as $N_2$ or $NH_3$ to a GCIB.

According to another example, a film containing W and Si is deposited using the introduction of tungsten hexafluoride ($WF_6$) and silicon tetrafluoride ($SiF_4$) to a GCIB.

According to another example, a film containing W, Si and N is deposited using the introduction of tungsten hexafluoride ($WF_6$), silicon tetrafluoride ($SiF_4$) and a nitrogen-containing gas such as $N_2$ or $NH_3$ to a GCIB.

According to another example, a film containing W, Si and O is deposited using the introduction of tungsten hexafluoride ($WF_6$), silicon tetrafluoride ($SiF_4$) and an oxygen-containing gas such as such as $O_2$ to a GCIB.

According to another example, a film containing W, Si, N and O is deposited using the introduction of tungsten hexafluoride ($WF_6$), silicon tetrafluoride ($SiF_4$), a nitrogen-containing gas such as $N_2$ or $NH_3$, and an oxygen-containing gas such as such as $O_2$ to a GCIB.

According to yet another example, a film containing W and C is deposited using the introduction of tungsten hexafluoride ($WF_6$) and a carbon-containing gas such as CO, $CO_2$, $CH_4$ (or hydrocarbon gas), or $CF_4$ (or fluorocarbon gas) to a GCIB.

When producing fluorocarbon-containing films, the fluorocarbon-containing specie can include a fluorocarbon gas ($C_xF_y$), wherein x and y are integers greater than or equal to unity, or hydrofluorocarbon gas ($C_xF_yH_z$), wherein x, y and z are integers greater than or equal to unity. The pressurized gas mixture can include $CF_4$, $C_3F_8$, $C_3F_6$, $C_2F_6$, $C_4F_6$, $C_4F_8$, $C_5F_8$, $CH_2F_2$, or $CHF_3$, or a combination of two or more thereof.

When producing fluorocarbon-containing films, other species of the pressurized gas mixture can include a silicon-containing material, a germanium-containing material, a carbon-containing material, an oxygen-containing material, a hydrogen-containing material, a nitrogen-containing material, a fluorine-containing material, a sulfur-containing material, a boron-containing material, a phosphorous-containing material, or an arsenic-containing material, or a combination of two or more thereof. For example, the pressurized gas mixture can further include $N_2$, $NH_3$, $NF_3$, NO, $N_2O$, $NO_2$, a hydrocarbon gas having the formula $C_xH_y$, wherein x and y are integers greater than or equal to unity, $H_2$, $O_2$, CO, $CO_2$, dichlorosilane ($SiH_2Cl_2$), trichlorosilane ($SiCl_3H$), diethylsilane ($C_4H_{12}Si$), trimethylsilane ($C_3H_{10}Si$), silicon tetrachloride ($SiCl_4$), silicon tetrafluoride ($SiF_4$), dichlorogermane ($GeH_2Cl_2$), trichlorogermane ($GeCl_3H$), diethylgermane ($C_4H_{12}Ge$), trimethylgermane ($C_3H_{10}Ge$), germanium tetrachloride ($GeCl_4$), germanium tetrafluoride ($GeF_4$), sulfur hexafluoride ($SF_6$), boron trifluoride ($BF_3$), diborane ($B_2H_6$), phosphine ($PH_3$), $PF_5$, arsine ($AsH_3$), $AsF_5$, or a noble gas, or a combination of two or more thereof.

In any one of the examples provided above, additional gases can be provided including an inert gas, such as a noble gas. Gas mixtures can be chosen based upon compatibility and stability.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method for depositing a thin film at a surface on a substrate, comprising:
    maintaining a reduced-pressure environment around a substrate holder for holding a substrate having a surface;
    holding said substrate securely within said reduced-pressure environment;
    providing to said reduced-pressure environment a gas cluster ion beam (GCIB) from a pressurized gas mixture comprising a silicon-containing specie and at least two of a nitrogen-containing specie, an oxygen containing specie, or a carbon-containing specie;
    accelerating said GCIB; and
    irradiating said accelerated GCIB onto at least a portion of said surface of said substrate to deposit a thin film containing silicon and at least two of nitrogen, oxygen or carbon on said at least a portion of said surface of said substrate.

2. The method of claim 1, wherein said silicon-containing specie comprises silane ($SiH_4$), disilane ($Si_2H_6$), dichlorosilane ($SiH_2Cl_2$), trichlorosilane ($SiCl_3H$), diethylsilane ($C_4H_{12}Si$), trimethylsilane ($C_3H_{10}Si$), silicon tetrachloride ($SiCl_4$), or silicon tetrafluoride ($SiF_4$), or a combination of two or more thereof.

3. The method of claim 1, wherein said nitrogen-containing specie comprises $N_2$, $NH_3$, $NF_3$, NO, $N_2O$, or $NO_2$, or a combination of two or more thereof.

4. The method of claim 1, wherein said carbon-containing specie comprises a hydrocarbon gas having the formula $C_xH_y$, wherein x and y are integers greater than or equal to unity.

5. The method of claim 1, wherein said carbon-containing specie comprises a fluorocarbon gas having the formula $C_xF_y$, wherein x and y are integers greater than or equal to unity.

6. The method of claim 1, wherein said carbon-containing specie comprises a hydrofluorocarbon gas having the formula $C_xH_yF_z$, wherein x, y and z are integers greater than or equal to unity.

7. The method of claim 1, wherein said carbon-containing specie comprises CO, $CO_2$, methane ($CH_4$) or carbon tetrafluoride ($CF_4$) or a combination thereof.

8. The method of claim 1, wherein said pressurized gas mixture further comprises a germanium-containing material, a hydrogen-containing material, a fluorine-containing material, a sulfur-containing material, a boron-containing material, a phosphorous-containing material, or an arsenic-containing material, or a combination of two or more thereof.

9. The method of claim 1, wherein said pressurized gas mixture further comprises sulfur hexafluoride ($SF_6$), boron trifluoride ($BF_3$), diborane ($B_2H_6$), phosphine ($PH_3$), $PF_5$, arsine ($AsH_3$), or $AsF_5$, or a combination of two or more thereof.

10. The method of claim 1, wherein said pressurized gas mixture further comprises germane ($GeH_4$), digermane ($Ge_2H_6$), dichlorogermane ($GeH_2Cl_2$), trichlorogermane ($GeCl_3H$), diethylgermane ($C_4H_{12}Ge$), trimethylgermane ($C_3H_{10}Ge$), germanium tetrachloride ($GeCl_4$), or germanium tetrafluoride ($GeF_4$), or a combination of two or more thereof.

11. The method of claim 1, wherein said pressurized gas mixture further comprises a noble gas.

12. The method of claim 1, further comprising:
    annealing said thin film.

13. The method of claim 1, wherein the gas clusters of said GCIB are accelerated by an acceleration voltage between 1 and 70 kV.

14. The method of claim 1, further comprising:
filtering said GCIB to substantially reduce the number of gas clusters having 100 or less atoms or molecules or both.

15. The method of claim 1, further comprising:
scanning said accelerated GCIB onto at least a portion of said surface of said substrate.

16. The method of claim 15, further comprising:
adjusting the GCIB dose as a function of position on said surface of said substrate in order to vary the thickness of said thin film deposited on said surface of said substrate.

17. The method of claim 1, wherein the thickness of said thin film that is deposited on said surface is achieved by selecting a GCIB dose.

18. A method for depositing a thin film at a surface on a substrate, comprising:
maintaining a reduced-pressure environment around a substrate holder for holding a substrate having a surface;
holding said substrate securely within said reduced-pressure environment;
providing to said reduced-pressure environment a gas cluster ion beam (GCIB) from a pressurized gas mixture comprising a metal-containing specie;
accelerating said GCIB; and
irradiating said accelerated GCIB onto at least a portion of said surface of said substrate to deposit a metal-containing thin film on said at least a portion of said surface of said substrate.

19. The method of claim 18, wherein said metal-containing specie comprises a tungsten-containing material.

20. The method of claim 19, wherein said metal-containing specie comprises tungsten hexafluoride ($WF_6$).

21. The method of claim 18, wherein said pressurized gas mixture further comprises a silicon-containing material, a germanium-containing material, a carbon-containing material, an oxygen-containing material, a hydrogen-containing material, a nitrogen-containing material, a fluorine-containing material, a boron-containing material, a phosphorous-containing material, or an arsenic-containing material, or a combination of two or more thereof.

22. The method of claim 18, wherein said pressurized gas mixture further comprises silane ($SiH_4$), disilane ($Si_2H_6$), dichlorosilane ($SiH_2Cl_2$), trichlorosilane ($SiCl_3H$), diethylsilane ($C_4H_{12}Si$), trimethylsilane ($C_3H_{10}Si$), silicon tetrachloride ($SiCl_4$), or silicon tetrafluoride ($SiF_4$), or a combination of two or more thereof.

23. The method of claim 22, wherein said pressurized gas mixture further comprises $H_2$, $O_2$, CO, $CO_2$, $N_2$, $NH_3$, $NF_3$, NO, $N_2O$, or $NO_2$, or a combination of two or more thereof.

24. The method of claim 18, wherein said pressurized gas mixture further comprises $H_2$, $O_2$, CO, $CO_2$, $N_2$, $NH_3$, $NF_3$, NO, $N_2O$, or $NO_2$, or a combination of two or more thereof.

25. The method of claim 18, wherein said metal-containing specie comprises a tungsten-containing material and wherein said pressurized gas mixture further comprises a silicon-containing material.

26. The method of claim 25, wherein said pressurized gas mixture further comprises a nitrogen-containing material or an oxygen-containing material or both.

27. The method of claim 18, wherein said metal-containing specie comprises a tungsten-containing material and wherein said pressurized gas mixture comprises a carbon-containing material.

28. The method of claim 18, wherein said pressurized gas mixture further comprises germane ($GeH_4$), digermane ($Ge_2H_6$), dichlorogermane ($GeH_2Cl_2$), trichlorogermane ($GeCl_3H$), diethylgermane ($C_4H_{12}Ge$), trimethylgermane ($C_3H_{10}Ge$), germanium tetrachloride ($GeCl_4$), or germanium tetrafluoride ($GeF_4$), or a combination of two or more thereof.

29. The method of claim 18, wherein said pressurized gas mixture further comprises a noble gas.

30. The method of claim 18, further comprising:
annealing said thin film.

31. The method of claim 18, wherein the gas clusters of said GCIB are accelerated by an acceleration voltage between 1 and 70 kV.

32. The method of claim 18, further comprising:
filtering said GCIB to substantially reduce the number of gas clusters having 100 or less atoms or molecules or both.

33. The method of claim 18, further comprising:
scanning said accelerated GCIB onto at least a portion of said surface of said substrate.

34. The method of claim 33, further comprising:
adjusting the GCIB dose as a function of position on said surface of said substrate in order to vary the thickness of said thin film deposited on said surface of said substrate.

35. The method of claim 18, wherein the thickness of said thin film that is deposited on said surface is achieved by selecting a GCIB dose.

36. A method for depositing a thin film at a surface on a substrate, comprising:
maintaining a reduced-pressure environment around a substrate holder for holding a substrate having a surface;
holding said substrate securely within said reduced-pressure environment;
providing to said reduced-pressure environment a gas cluster ion beam (GCIB) from a pressurized gas mixture comprising a fluorocarbon-containing specie;
accelerating said GCIB; and
irradiating said accelerated GCIB onto at least a portion of said surface of said substrate to deposit a fluorocarbon-containing thin film on said at least a portion of said surface of said substrate.

37. The method of claim 36, wherein said fluorocarbon-containing specie comprises a fluorocarbon gas having the formula $C_xF_y$, wherein x and y are integers greater than or equal to unity.

38. The method of claim 36, wherein said fluorocarbon-containing specie comprises a hydrofluorocarbon gas having the formula $C_xH_yF_z$, wherein x, y and z are integers greater than or equal to unity.

39. The method of claim 36, wherein said fluorocarbon-containing specie comprises $CF_4$, $C_3F_8$, $C_3F_6$, $C_2F_6$, $C_4F_6$, $C_4F_8$, $C_5F_8$, $CH_2F_2$, or $CHF_3$, or a combination of two or more thereof.

40. The method of claim 36, wherein said pressurized gas mixture further comprises a silicon-containing material, a germanium-containing material, a carbon-containing material, an oxygen-containing material, a hydrogen-containing material, a nitrogen-containing material, a fluorine-containing material, a boron-containing material, a phosphorous-containing material, or an arsenic-containing material, or a combination of two or more thereof.

41. The method of claim 36, wherein said pressurized gas mixture further comprises silane ($SiH_4$), disilane ($Si_2H_6$), dichlorosilane ($SiH_2Cl_2$), trichlorosilane ($SiCl_3H$), diethylsilane ($C_4H_{12}Si$), trimethylsilane ($C_3H_{10}Si$), silicon tetrachloride ($SiCl_4$), or silicon tetrafluoride ($SiF_4$), or a combination of two or more thereof.

42. The method of claim 36, wherein said pressurized gas mixture further comprises $H_2$, $O_2$, CO, $CO_2$, $N_2$, $NH_3$, $NF_3$, NO, $N_2O$, or $NO_2$, or a combination of two or more thereof.

43. The method of claim 36, wherein said pressurized gas mixture further comprises a noble gas.

44. The method of claim 36, further comprising:
providing a mask on at least a portion of said substrate.

45. The method of claim 36, further comprising:
controllably flowing said pressurized gas mixture so as to control nucleation of the gas mixture constituents into gas clusters.

46. The method of claim 36, wherein said substrate comprises a conductive material, a non-conductive material, or a semi-conductive material.

47. The method of claim 36, further comprising:
controlling the temperature of said substrate.

48. The method of claim 36, further comprising:
thermally treating said thin film.

49. The method of claim 36, wherein the gas clusters of said GCIB are accelerated by an acceleration voltage between 1 and 70 kV.

50. The method of claim 36, further comprising:
filtering said GCIB to substantially reduce the number of gas clusters having 100 or less atoms or molecules or both.

51. The method of claim 36, further comprising:
scanning said accelerated GCIB onto at least a portion of said surface of said substrate.

52. The method of claim 51, further comprising:
adjusting the GCIB dose as a function of position on said surface of said substrate in order to vary the thickness of said thin film deposited on said surface of said substrate.

53. The method of claim 36, wherein the thickness of said thin film that is deposited on said surface is achieved by selecting a GCIB dose.

* * * * *